United States Patent
Agarwal et al.

(10) Patent No.: US 6,365,486 B1
(45) Date of Patent: Apr. 2, 2002

(54) METHOD OF FABRICATING SEMICONDUCTOR DEVICES UTILIZING IN SITU PASSIVATION OF DIELECTRIC THIN FILMS

(75) Inventors: Vishnu K. Agarwal; Gurtej S. Sandhu; Garo J. Derderian, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/478,745

(22) Filed: Jan. 6, 2000

Related U.S. Application Data

(62) Division of application No. 09/114,847, filed on Jul. 14, 1998, now Pat. No. 6,201,276.

(51) Int. Cl.⁷ ............................................. H01L 21/324
(52) U.S. Cl. .................... 438/393; 438/386; 438/396; 438/253; 438/240
(58) Field of Search ................... 438/250, 396, 438/393, 253, 243; 257/310

(56) References Cited

U.S. PATENT DOCUMENTS

| | | | |
|---|---|---|---|
| 4,621,277 A | * | 11/1986 | Ito et al. |
| 5,065,220 A | | 11/1991 | Paterson et al. ............... 357/51 |
| 5,153,685 A | | 10/1992 | Murata et al. .............. 357/23.6 |
| 5,189,503 A | | 2/1993 | Suguro et al. .............. 257/310 |
| 5,290,609 A | * | 3/1994 | Horiike et al. |
| 5,352,623 A | * | 10/1994 | Kamiyama |
| 5,397,748 A | | 3/1995 | Watanabe et al. ............ 437/239 |
| 5,434,109 A | * | 7/1995 | Geissler et al. |
| 5,445,999 A | * | 8/1995 | Thakur et al. |
| 5,521,112 A | * | 5/1996 | Tseng |
| 5,521,127 A | * | 5/1996 | Hori |
| 5,641,702 A | | 6/1997 | Imai et al. ................... 438/396 |
| 5,780,364 A | * | 7/1998 | Thakur |
| 5,804,488 A | * | 9/1998 | Shih et al. |
| 5,804,852 A | | 9/1998 | Yang et al. .................. 257/308 |
| 5,910,880 A | * | 6/1999 | DeBoer et al. |
| 5,943,568 A | * | 8/1999 | Fujii et al. |
| 6,017,791 A | * | 1/2000 | Wang et al. |
| 6,096,592 A | * | 8/2000 | Cho |
| 6,171,981 B1 | * | 1/2001 | Byun |

OTHER PUBLICATIONS

Stanley Wolf and Richard N. Tauber, "Silicon Processing for the VLSI Era, vol. 1: Process Technology," Lattice Press, Sunset Beach, California, 1986, pp. 177–178.*

W.–S. Lu et al., "A Systematic Study of the Initial Electrical and Radiation Hardness Properties of Reoxidized Nitrided Oxides by Rapid Thermal Processing," IEEE Transactions on Nuclear Science, vol. 42, No. 3, Jun. 1995, pp. 167–173.*

* cited by examiner

Primary Examiner—Charles Bowers
Assistant Examiner—Stephen W. Smoot
(74) Attorney, Agent, or Firm—Workman, Nydegger & Seeley

(57) ABSTRACT

A capacitor for a semiconductor device is fabricated by a method which reduces the interaction of a capacitor electrode and a dielectric layer in the capacitor. One or more passivation layers are formed at the interface between the dielectric layer and an electrode in the capacitor by exposing the dielectric layer or electrode to a reactive environment during fabrication in order to form a passivation layer thereon prior to forming an overlying dielectric layer or electrode. The passivation layer reduces the diffusion of oxygen from the dielectric layer to the electrode, resulting in reduced current leakage in the capacitor.

51 Claims, 8 Drawing Sheets

METHOD OF FABRICATING SEMICONDUCTOR DEVICES UTILIZING IN SITU PASSIVATION OF DIELECTRIC THIN FILMS

This application is a divisional of application Ser. No. 09/114,847, filed on Jul. 14, 1998, now U.S. Pat. No. 6,201,276, which is incorporated herein by reference.

BACKGROUND OF THE INVENTION

1. The Field of the Invention

The present invention relates to methods for manufacturing semiconductor devices. More particularly, the present invention relates to methods for fabricating a semiconductor device, such as a capacitor, which utilize in situ passivation of dielectric thin films during fabrication.

2. The Relevant Technology

As integrated circuit technology has progressed, it has become possible to store ever-increasing amounts of digital data in a smaller space at less expense and still access the data randomly, quickly and reliably. Central to this increased ability to store and retrieve data has been the dynamic random access memory (DRAM), fabricated as an integrated circuit. The memory cells of DRAMs are comprised of two main components, a transistor and a capacitor. The capacitor of each memory cell functions to store an electrical charge representing a digital value (e.g., a charged capacitor representing a 1 and a discharged capacitor representing a 0) with the transistor acting as a switch to connect the capacitor to the "outside world" via decoding and other circuitry. In order to function properly, the capacitor must possess a minimum amount of capacitance. If a capacitor exhibits too little capacitance, it will cause errors in data storage.

The capacitive value of a capacitor is dependent upon the dielectric constant of the material placed between the plates of the capacitor, the distance btween the plates, and the effective area of the plates. In the case of integrated circuits, the material used as a dielectric between the plates is generally limited to only a few materials.

The interaction of dielectric materials and capacitor electrode materials plays a critical role in determining electrical properties such as leakage current of capacitors in integrated circuits and advanced packages. The electrode material can interact with the dielectric material during deposition and further processing. For example, the electrode material can adsorb some of the oxygen from the dielectric film, making the dielectric film oxygen deficient. The oxygen deficient dielectric film demonstrates current leakage, and is unacceptable for use in a DRAM or other semiconductor applications.

Various approaches have been developed in an attempt to reduce leakage current problems in capacitors. For example, U.S. Pat. No. 5,641,702 to Imai et al. discloses a method of forming an integrated circuit capacitor with an insulating film having a high permittivity, which includes annealing the insulating film in a reactive oxygen atmosphere to reduce leakage current in the capacitor. In U.S. Pat. No. 5,189,503 to Suguro et al., a capacitor having a two-part dielectric insulating layer is disclosed, including a first metal oxide film with pieces of a dissimilar metal element added to the oxide, such as tantalum oxide with a zirconium additive, and a second metal oxide film such as tungsten oxide. The disclosure in the Suguro patent indicates that excessive oxygen may be added to a tantalum oxide layer to reduce oxygen deficiency and the associated leakage current. In U.S. Pat. No. 5,153,685 to Murata et al., an integrated circuit capacitor having a two-part dielectric layer including silicon nitride and silicon dioxide is disclosed. The silicon nitride is formed on the lower electrode, and the silicon dioxide is formed from the silicon nitride by a high pressure oxidation process.

While the above approaches have made some progress in reducing leakage current problems in capacitors, there is still a need for improved capacitor fabrication methods that further reduce or prevent the adsorption of oxygen from dielectric films by capacitor electrodes.

SUMMARY OF THE INVENTION

The present invention is directed to methods of fabrication for semiconductor devices such as capacitors and novel capacitor structures formed thereby which can be used in memory cells of a DRAM device. The present methods provide a protective barrier in the form of one or more passivation layers in a capacitor structure, which reduce the interaction of an electrode and dielectric film in the capacitor at their interface. This reduces the diffusion of oxygen from the dielectric film to the electrode, thereby reducing current leakage and the like.

In one aspect of the present invention, various methods are provided for fabricating capacitor structures. In one method of the present invention, a first conductive layer or electrode is formed on a semiconductor substrate, and a dielectric layer is formed on the first conductive layer. The dielectric layer is exposed to or annealed in a reactive environment in order to form a passivation layer on the dielectric layer. The reactive environment that is used in forming the passivation layer is a gas or mixture of gases, which can optionally be altered using any type of plasma or energy. The dielectric layer can be optionally annealed in an oxidizing environment prior to forming the passivation layer thereover. A second conductive layer is then formed on the passivation layer to complete construction of the capacitor structure.

In an alternative method of the invention, the above steps are performed, except that the passivation layer and dielectric layer are annealed in an oxidative environment to saturate the passivation layer and the dielectric layer with oxygen prior to forming the second conductive layer. In a further alternative method, the steps of annealing in the reactive environment and annealing in the oxidative environment are repeated in a cyclic process prior to forming the second conductive layer.

In another method of the invention, a first conductive layer is formed on a semiconductor substrate, and the first conductive layer is exposed to a reactive environment in order to form a passivation layer on the first conductive layer. A dielectric layer is then formed on the passivation layer, and a second conductive layer is formed on the dielectric layer to complete construction of the capacitor structure. Alternatively, a second passivation layer can be formed on the dielectric layer prior to forming the second conductive layer.

In a further method of the invention, a first conductive layer is formed on a semiconductor substrate, and a thin first dielectric layer is formed on the first conductive layer. The first dielectric layer is then exposed to a reactive environment in order to form a passivation layer on the first dielectric layer. A second dielectric layer is then formed on the passivation layer, and a second conductive layer is formed on the second dielectric layer to complete construction of the capacitor structure. Alternatively, a second passivation layer can be formed on the second dielectric layer prior to forming the second conductive layer.

In another aspect of the invention, various capacitor structure embodiments fabricated according to the above described methods are provided.

Other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1A:
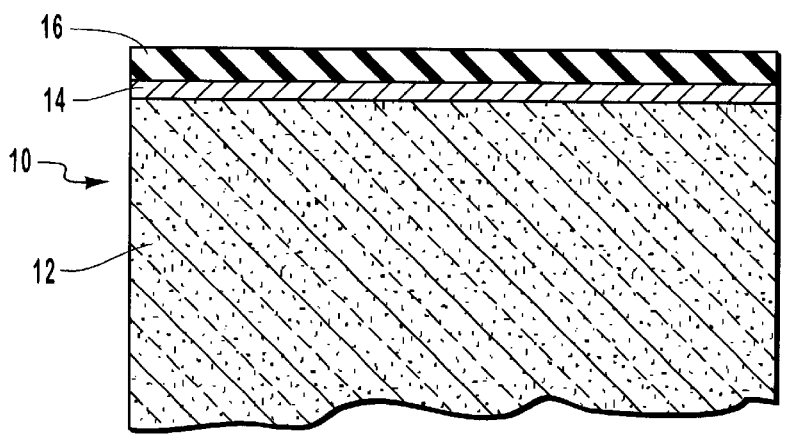
FIGS. 1A–1C are partial cross-sectional schematic views showing successive steps in one method for manufacturing a semiconductor device according to the present invention.

The present invention is directed to methods for fabricating a semiconductor device such as capacitors used in memory cells of a DRAM device. As discussed in greater detail below, a capacitor formed according to the present invention generally includes a first conductive layer in the form of a lower capacitor plate or electrode, a dielectric layer over the first conductive layer, and a second conductive layer in the form of an upper capacitor plate or electrode over the dielectric layer. One or more passivation layers are formed at the interface between the dielectric layer and an electrode in order to reduce the interaction of the electrode and the dielectric layer. This reduces the diffusion of oxygen from the dielectric layer to the electrode, resulting in improved leakage current properties in the capacitor.

As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator and silicon-on-sapphire.

Referring to the drawings, wherein like structures are provided with like reference designations, the drawings are schematic representations showing successive steps in various alternative methods according to the present invention for manufacturing a capacitor used in integrated circuit structures. The drawings only show the structures necessary to understand the present invention, and thus additional structures known in the art have not been included to maintain the clarity of the drawings.

Figure 1B:
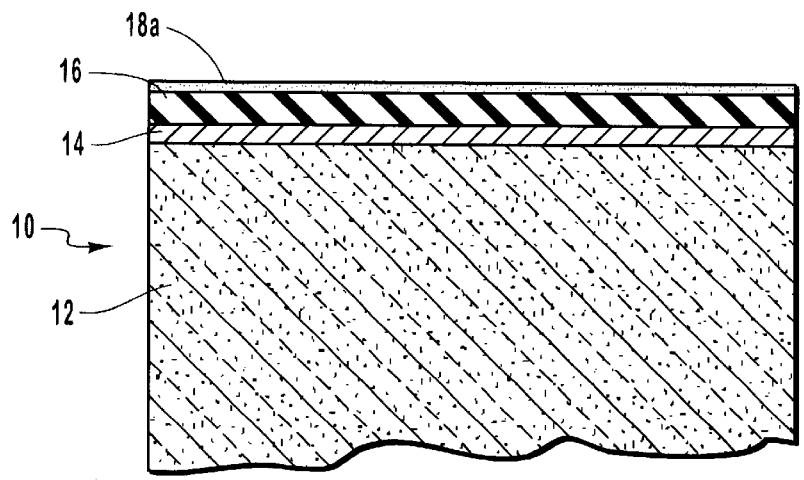
Figure 1C:
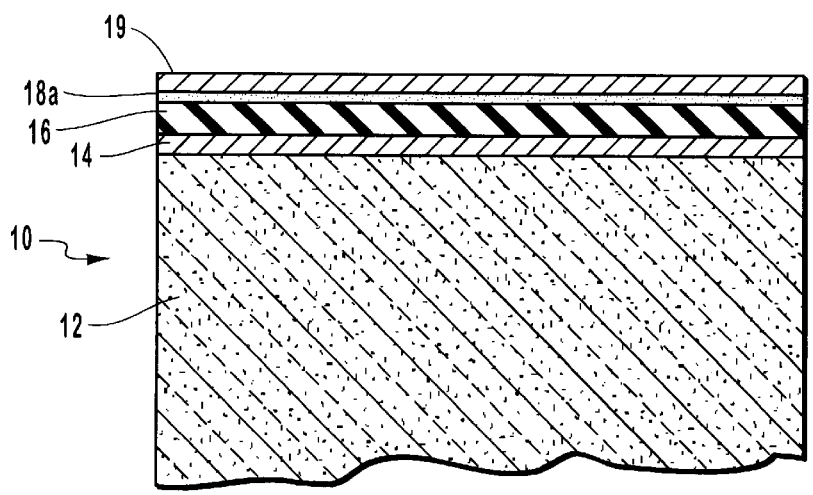

FIGS. 1A–1C show successive steps in a method for manufacturing a capacitor structure 10 for a semiconductor device, such as a DRAM device, according to the present invention. As depicted in FIG. 1A, the capacitor structure 10 has been partially fabricated according to techniques known in the art, and includes a semiconductor substrate 12 such as a silicon substrate, and a first conductive layer in the form of a lower electrode 14 made of a conductive material which is formed over substrate 12. The lower electrode 14 is formed by conventional techniques such as chemical vapor deposition (CVD), and can have a thickness in the range from about 100 angstroms to about 3,000 angstroms. The lower electrode 14 can be formed of various conductive materials such as polysilicon, titanium nitride, tungsten, molybdenum, tungsten silicide, tantalum, tungsten nitride, Pt, Ru, $RuO_x$, Ir, $IrO_x$, Pt combinations thereof, and the like. The lower electrode 14 functions as a lower capacitor plate such as for a memory cell of a DRAM device, and is conductively connected to active areas (not shown) in the device.

A dielectric insulating film in the form of a dielectric layer 16 is formed over lower electrode 14, as shown in FIG. 1A, by conventional techniques. For example, dielectric layer 16 can be formed by a CVD process in a tube furnace. The dielectric layer 16 can have a thickness in the range from about 10 angstroms to about 1000 angstroms. Dielectric layer 16 can be made of various insulating materials, such as silicon nitride, silicon dioxide, tantalum oxide, strontium titanate, and barium strontium titanate.

The partially formed capacitor structure as shown in FIG. 1A is then exposed to a suitable reactive environment in situ in order to form or grow a passivation layer 18a on the upper surface of dielectric layer 16 as shown in FIG. 1B. For example, passivation layer 18a can be formed by annealing dielectric layer 16 in an oxygen-free or reducing reactive atmosphere while the partially formed capacitor structure is still in a deposition chamber for depositing dielectric layer 16. Optionally, dielectric layer 16 can be annealed in an oxidizing atmosphere if desired prior to forming passivation layer 18a.

The passivation layer 18a is preferably formed by annealing dielectric layer 16 in the reactive atmosphere at a temperature in the range from about 100° C. to about 1100° C. The reactive atmosphere for producing passivation layer 18a can be composed of various gaseous materials, such as nitrogen, hydrogen, ammonia, hydrazine $N_2H_4$), monomethyl hydrazine (MMH), forming gas (gas mixture of $H_2+N_2$), carbon tetrafluoride ($CF_4$), $CHF_3$, hydrochloric acid (HCl), boron trichloride ($BCl_3$), mixtures thereof, and the like. The nature of the reactive gaseous environment can be altered or enhanced if desired by using any type of plasma source (e.g., electron cyclotron residence (ECR), inductive coupled plasma (ICP), radio frequency (RF), remote, etc.), rapid thermal nitridization (RTN), or other energy sources.

The exposure of dielectric layer 16 to the reactive environment converts the top few monolayers of dielectric layer 16 into passivation layer 18a, which limits or stops oxygen, carbon, and other species from transporting between dielectric layer 16 and an upper electrode material, which is discussed in further detail below. The thickness of the passivation layer can be optimized to provide an effective diffusion barrier without sacrificing charge storage capacity of the capacitor. Accordingly, the passivation layer can have a thickness in the range from about 10 angstroms to about 100 angstroms. Stated otherwise, the passivation layer can have thickness in the range from a faction of a monolayer to about one (1) monolayer. The formed passivation layer can include compounds having the formula $M(O)_y X_z$, $M(O))W_n$, $M_x X_y$, or any other compound where M can be any specie or all species in the oxide dielectric layer other than oxygen or nitrogen, such as silicon, tantalum, strontium titanate, barium strontium titanate, boron, boron phosphate, phosphorus, etc.; X, Y, and W can be nitrogen, fluorine, carbon, chlorine, iodine, and $CO_3$; and n, x, y and z can be integers from 1 to 6. Various combinations of chemical compounds having the above formulas can also be present in the passivation layer.

The passivation layer forms a protective barrier at the interface between the dielectric layer and the electrode. For example, if tantalum oxide is used to form the dielectric layer, and ammonia gas is present in the reactive environment, a very thin film of tantalum nitride or tantalum oxynitride is grown by reaction of the ammonia gas with the surface of the dielectric layer exposed to the ammonia gas. This thin film acts as a diffusion barrier between the upper electrode and the dielectric layer. Other compounds such as tantalum fluoride and tantalum carbide can be formed in the passivation layer when other types of gaseous materials are present in the reactive environment.

As shown in FIG. 1C, a second conductive layer in the form of an upper electrode 19 made of a conductive material is then formed over passivation layer 18a and dielectric 11 layer 16. The upper electrode 19 is formed by conventional techniques such as CVD, and can have a thickness in the range from about 200 angstroms to about 4,000 angstroms. The upper electrode 19 can be formed of various conductive materials, such as the materials used to form lower electrode 14. The upper electrode 19 functions as an upper capacitor plate such as for a memory cell of a DRAM device. The formation of upper electrode 19 completes construction of the capacitor elements for capacitor structure 10.

In a variation of the method of manufacture shown in FIGS. 1A–1C, the above described steps are followed except that the passivation layer is further annealed in an oxidizing environment, to saturate the passivation layer and dielectric layer with oxygen, prior to formation of the upper electrode. Thus, the partially formed capacitor structure shown in FIG. 1B, including passivation layer 18a over dielectric layer 16, is annealed in an oxidizing atmosphere prior to formation of upper electrode 19 to complete the capacitor structure.

Figure 2A:
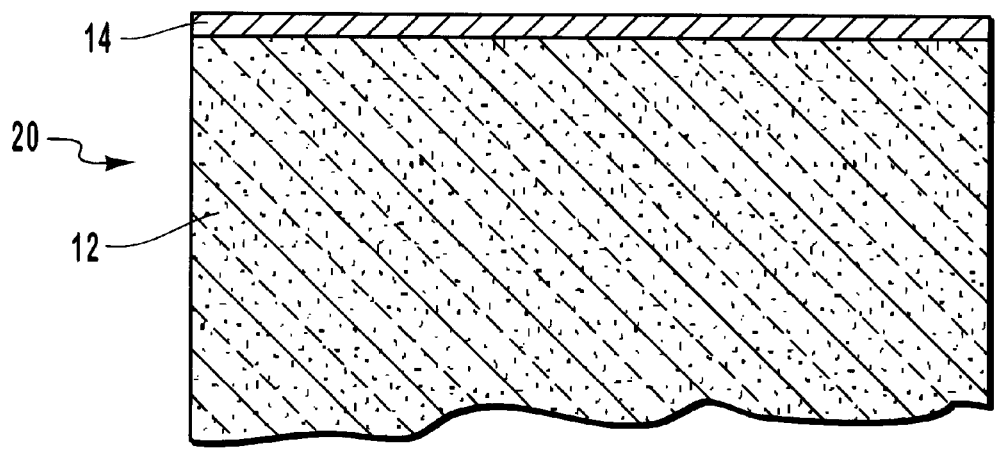
FIGS. 2A–2D are partial cross-sectional schematic views showing successive steps in another method for manufacturing a semiconductor device according to the present invention.

FIGS. 2A–2D show successive steps in manufacturing a capacitor structure 20 for a semiconductor device according to another method of the invention. As depicted in FIG. 2A, the capacitor structure 20 has been partially fabricated according to techniques known in the art, and includes a semiconductor substrate 12 such as a silicon substrate, and a first conductive layer in the form of a lower electrode 14 which is formed over substrate 12.

Figure 2B:
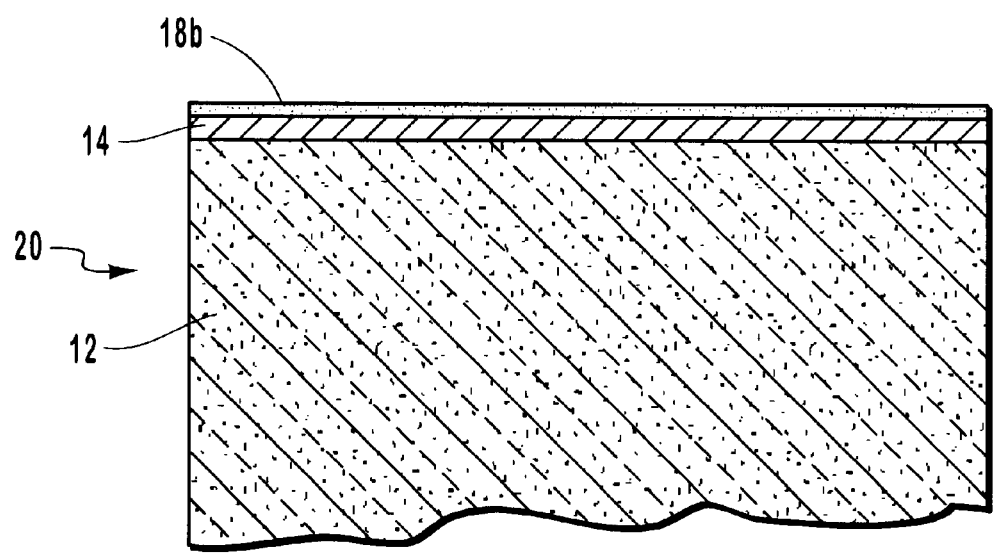

The partially formed capacitor structure as shown in FIG. 2A is then exposed to a suitable reactive environment in situ in order to form a passivation layer 18b on lower electrode 14 as shown in FIG. 2B. The passivation layer 18b is formed in the same manner and from the same gaseous materials as discussed above for passivation layer 18a of FIG. 1B. Optionally, lower electrode 14 can be annealed prior to forming passivation layer 18b. The exposure of lower electrode 14 to the reactive environment converts the top few monolayers of lower electrode 14 into passivation layer 18b, which can have a thickness in the range from about 4 angstroms to about 30 angstroms. Stated otherwise, the passivation layer can have thickness in the range from a faction of a monolayer to about one (1) monolayer. The passivating layer 18b can include the same chemical compounds as discussed above for passivation layer 18a.

Figure 2C:
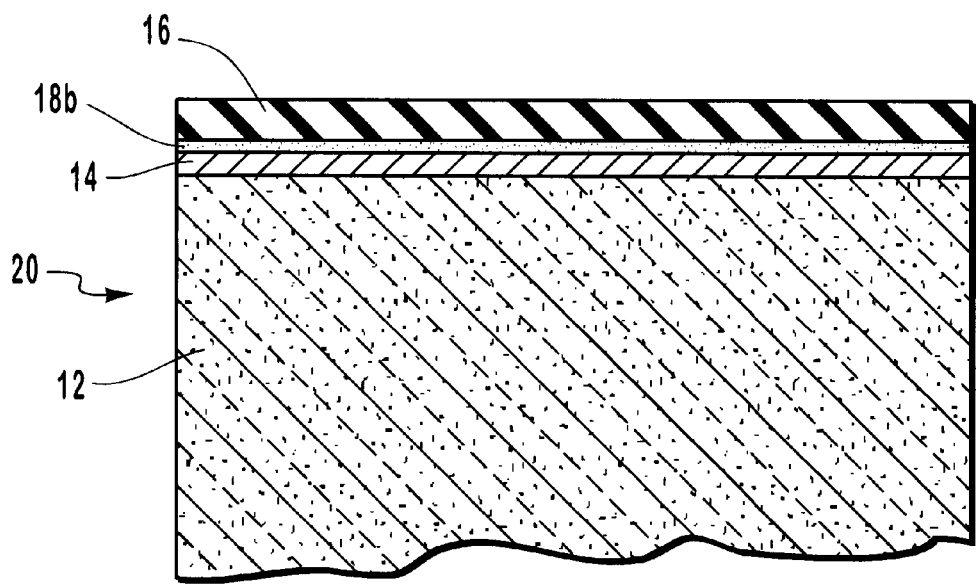

An insulating dielectric layer 16 is then formed over passivation layer 18b and lower electrode 14, as shown in FIG. 2C, by conventional techniques. The passivation layer 18b provides a protective barrier for lower electrode 14 during formation of dielectric layer 16 to prevent oxidation of lower electrode 14. Optionally, passivation layer 18b can be annealed in an oxidizing environment to saturate passivation layer 18b with oxygen prior to formation of dielectric layer 16. The passivation layer 18b limits or stops oxygen, carbon, and other species from transporting between dielectric layer 16 and lower electrode 14.

Figure 2D:
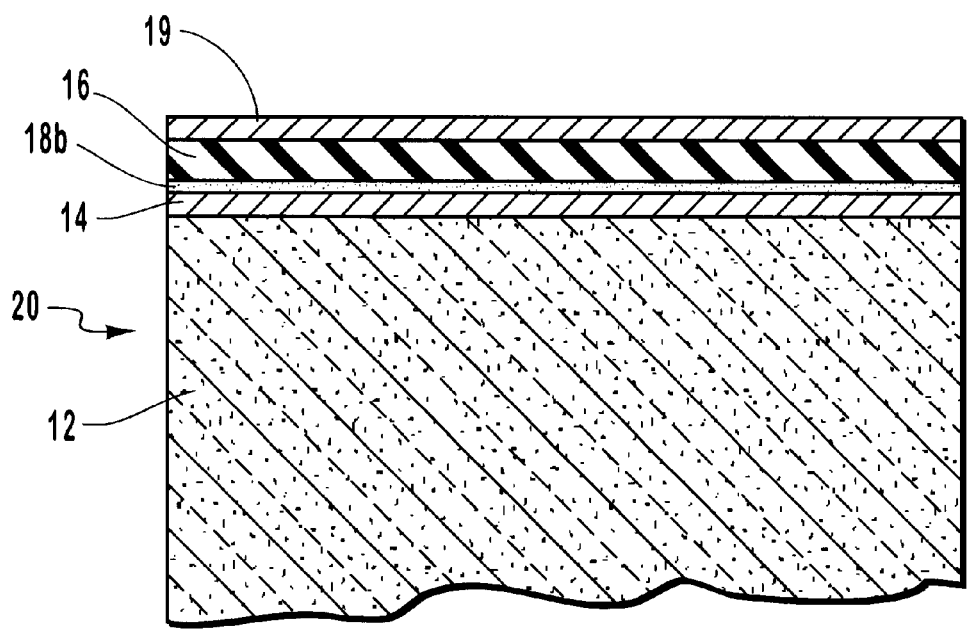

A second conductive layer in the form of an upper electrode 19 is then formed over dielectric layer 16 by conventional techniques, as depicted in FIG. 2D. The formation of upper electrode 19 completes construction of the capacitor elements for capacitor structure 20.

Figure 3A:
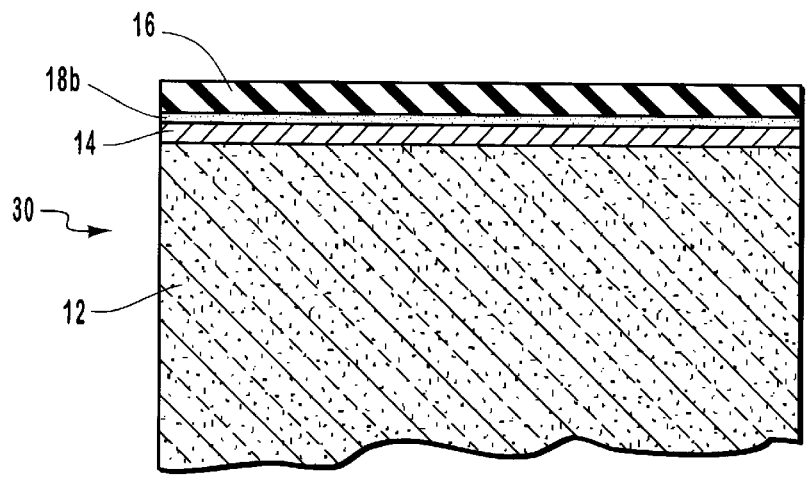
FIGS. 3A–3C are partial cross-sectional schematic views showing successive steps in a further method for manufacturing a semiconductor device according to the present invention.
Figure 3B:
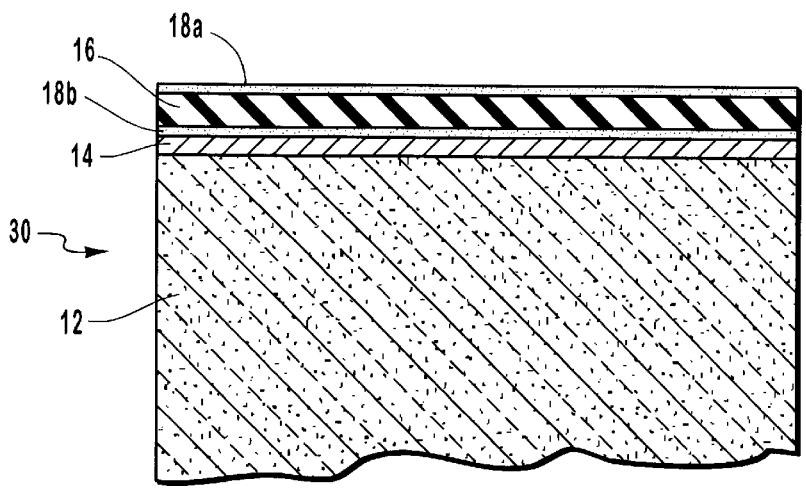
Figure 3C:
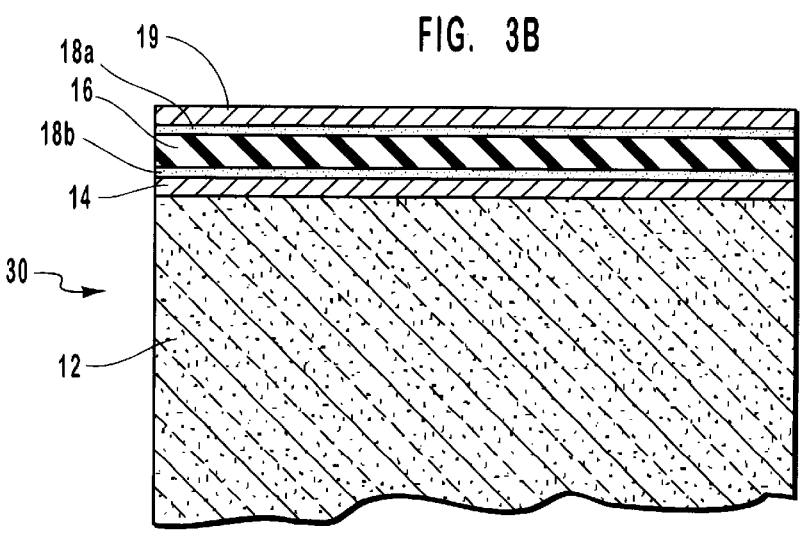

FIGS. 3A–3C show successive steps in manufacturing a capacitor structure 30 for a semiconductor device according to a further method of the invention, which incorporates steps from both the methods shown in FIGS. 1A–1C and FIGS. 2A–2D. Accordingly, as depicted in FIG. 3A, the capacitor structure 30 has been partially fabricated as discussed above and shown in FIG. 2C, and includes a semiconductor substrate 12, a lower electrode 14 formed over substrate 12, a passivation layer 18b on lower electrode 14, and a dielectric layer 16 formed over passivation layer 18b and lower electrode 14.

As shown in FIG. 3B, a passivation layer 18a is then formed over dielectric layer 16 in the same manner as discussed above in relation to FIG. 1B. An upper electrode 19 is then formed over passivation layer 18a, as shown in FIG. 3C, to complete construction of the capacitor elements for capacitor structure 30. Optionally, passivation layer 18a can be annealed in an oxidizing environment prior to forming upper electrode 19 thereover. The passivation layer 18b in capacitor structure 30 provides a barrier to the transport of oxygen, carbon, and other species from dielectric layer 16 to lower electrode 14, while passivation layer 18a provides a similar species transport barrier between dielectric layer 16 and upper electrode 19.

Figure 4A:
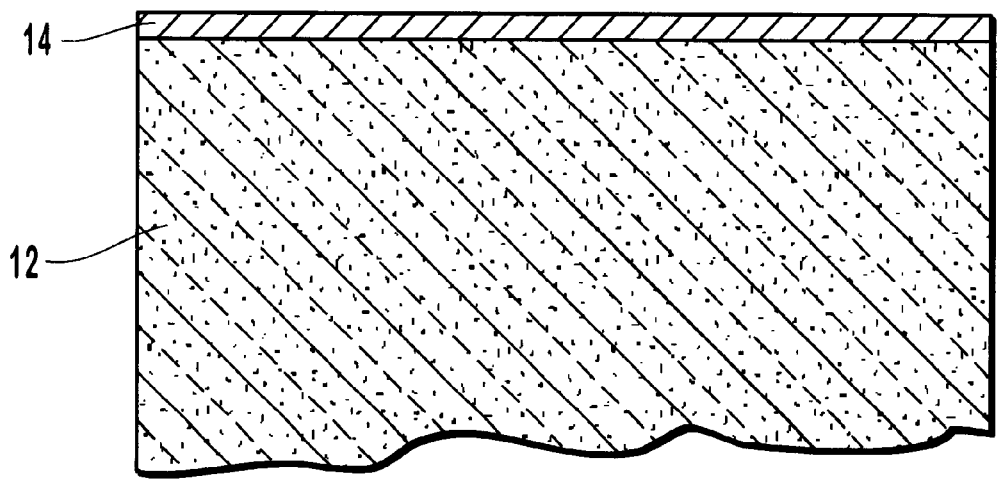
FIGS. 4A–4D are partial cross-sectional schematic views showing successive steps in another method for manufacturing a semiconductor device according to the present invention.
Figure 4B:
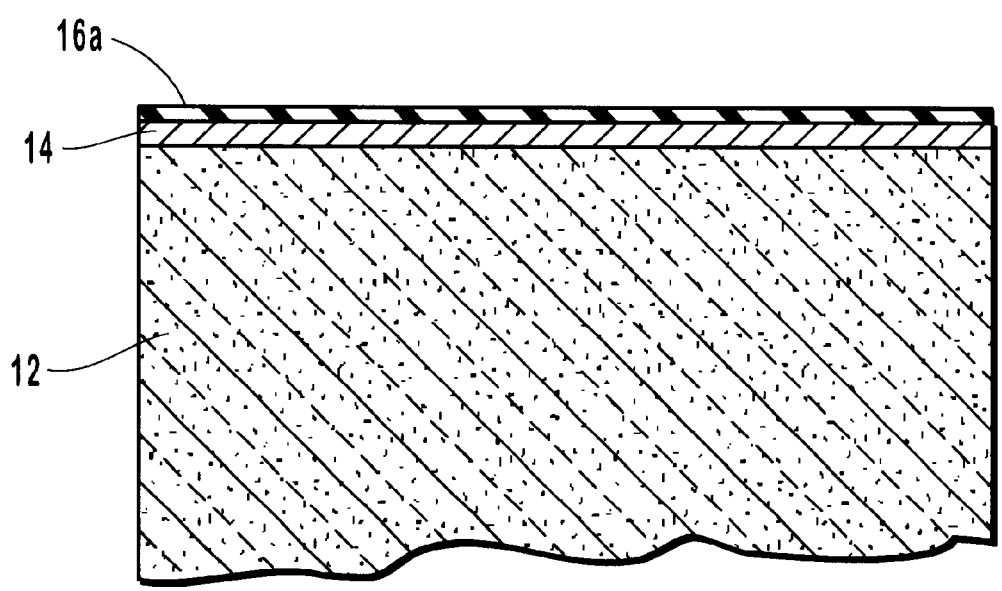

FIGS. 4A–4D show successive steps in manufacturing a capacitor structure for a semiconductor device according to another method of the invention. As depicted in FIG. 4A, a capacitor structure has been partially fabricated according to techniques known in the art, and includes a semiconductor substrate 12, and a lower electrode 14 which is formed over substrate 12. As shown in FIG. 4B, a thin first dielectric layer 16a is formed over lower electrode 14 by conventional techniques. The first dielectric layer 16a can have a thickness in the range from about 10 angstroms to about 1000 angstroms.

Figure 4C:
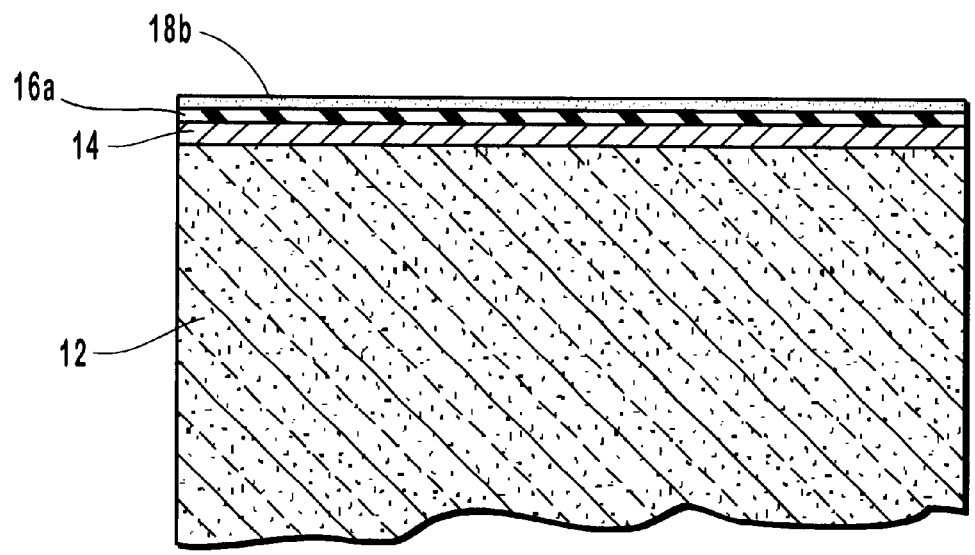
Figure 4D:
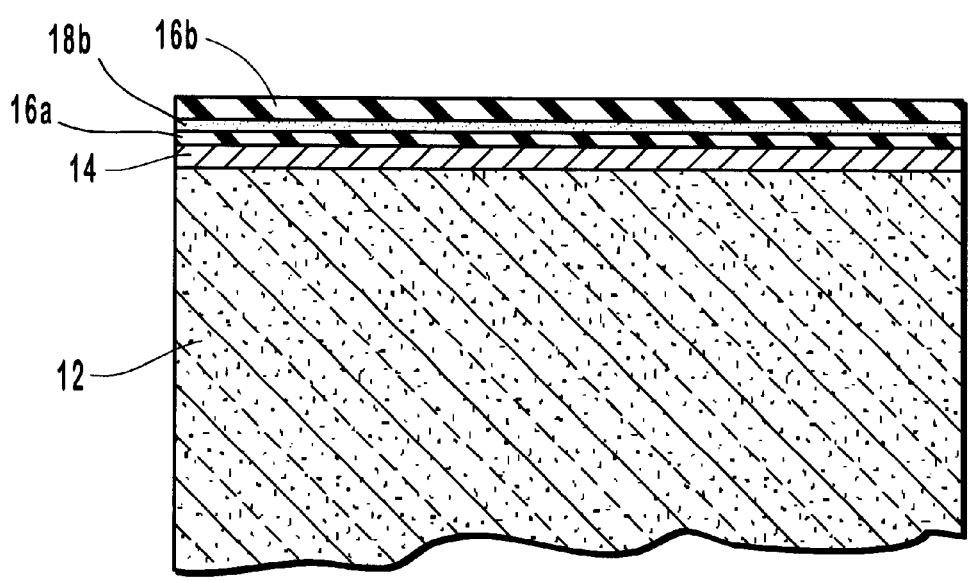

This partially formed capacitor structure is then exposed to a suitable reactive environment in order to form a passivation layer 18b on first dielectric layer 16a, as illustrated in FIG. 4C. Optionally, first dielectric layer 16a can be converted to passivating layer 18b completely, which may be conductive. A second dielectric layer 16b is then formed over passivation layer 18b on first dielectric layer 16a, as shown in FIG. 4D, by conventional techniques. The second dielectric layer 16b can have a thickness in the range from about 10 angstroms to about 1000 angstroms. Optionally, passivation layer 18b can be annealed in an oxidizing environment to saturate passivation layer 18b and first dielectric layer 16a with oxygen prior to formation of second dielectric layer 16b.

Figure 5A:
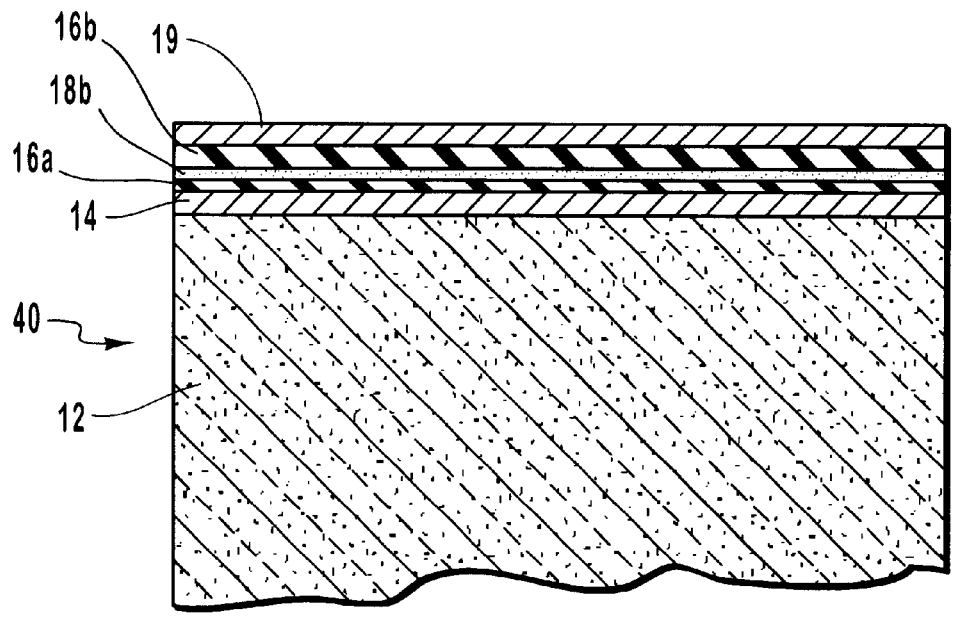
FIGS. 5A and 5B are partial cross-sectional schematic views of alternative capacitor structure embodiments formed utilizing the method of FIGS. 4A–4D.
Figure 5B:
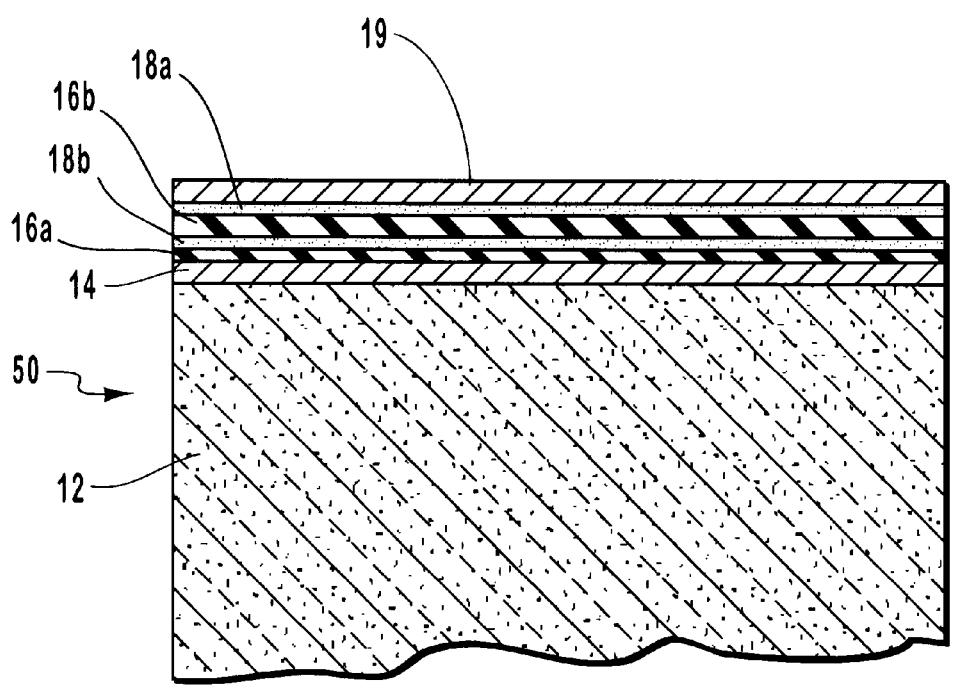

FIGS. 5A and 5B show alternative capacitor structures which can be constructed utilizing the method steps of FIGS. 4A–4D. Accordingly, the partially constructed capacitor of FIG. 4D is subjected to further processing to form a capacitor structure 40 as shown in FIG. 5A, or a capacitor structure 50 as shown in FIG. 5B.

In order to form capacitor structure 40 of FIG. 5A, an upper electrode 19 is formed over second dielectric layer 16b by conventional techniques. The formation of upper electrode 19 completes construction of the capacitor elements for capacitor structure 40.

In order to form capacitor structure 50 of FIG. 5B, the partially formed capacitor structure of FIG. 4D is exposed to a suitable reactive environment in order to form a passivation layer 18a on second dielectric layer 16b. An upper electrode 19 is then formed over passivation layer 18a and second dielectric layer 16b by conventional techniques. Optionally, passivation layer 18a can be annealed in an oxidizing environment to saturate passivation layer 18a and second dielectric layer 16b with oxygen prior to formation of upper electrode 19. The formation of upper electrode 19 completes construction of the capacitor elements for capacitor structure 50.

Figure 6:
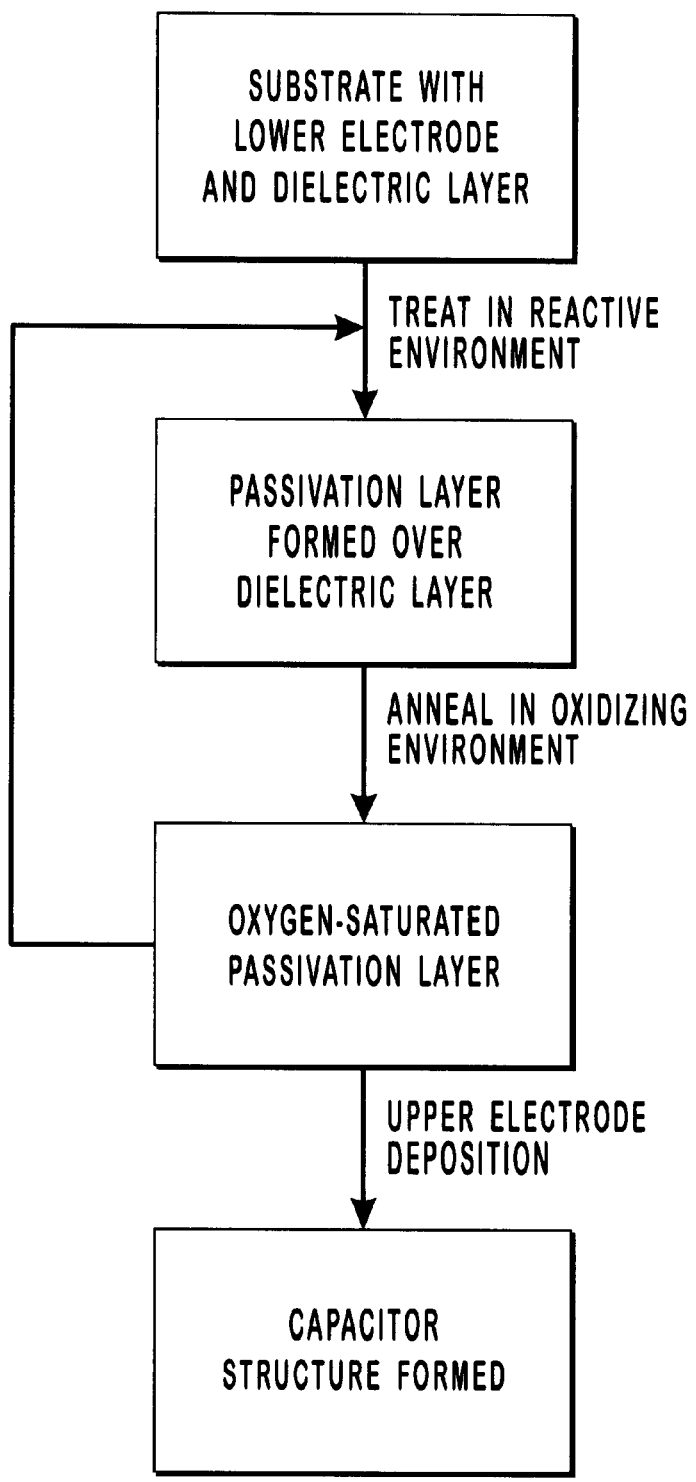
FIG. 6 is a process flow diagram showing successive steps in an alternative method for manufacturing a capacitor according to the present invention.

FIG. 6 is a process flow diagram showing successive steps in an alternative method for manufacturing a capacitor according to the present invention. A substrate with a lower electrode and a dielectric layer, such as shown in FIG. 1A, is treated in a suitable reactive environment to form a passivation layer over the dielectric layer, such as shown in FIG. 1B, which in turn is annealed in an oxidizing environment to form an oxygen-saturated passivation layer. The process steps of treating in a reactive environment and annealing in an oxidizing environment can then be cyclically repeated a desired number of times in order to make a saturated passivation layer which does not show any transient diffusion processes. Once the treatment and annealing cycle has been completed, an upper electrode is deposited over the passivation layer to complete formation of the capacitor structure, such as shown in FIG. 1C.

The cycling treatment and annealing process represented in FIG. 6 provides increased integrity, strength and thickness to the passivation layer. The cycle of treatment and annealing can be repeated as many times as needed to achieve the desired properties for the passivation layer. For example, the cycle can be repeated 2 or 3 times or more if desired.

It should be understood that the cycling treatment and annealing process represented in FIG. 6 can be used anytime a passivation layer is formed according to the methods of the present invention. Accordingly, the cycling process of FIG. 6 can be used as part of any of the methods discussed herein, such as when the passivation layer is formed on the lower electrode as shown in FIG. 2B, or when passivation layers are formed over the lower electrode and the dielectric layer, as shown in FIG. 3B.

The methods of the present invention provide many advantages and benefits. The passivation layer formed according to the present invention at the interface between the dielectric layer and an electrode reduces or minimizes the chemical interaction of the electrode and the dielectric layer. This reduces the diffusion of oxygen from the dielectric layer to the electrode, resulting in improved leakage current properties for capacitors fabricated according to the present invention. Without passivation, the electrical properties of a capacitor can significantly deteriorate. Thus, the present invention particularly allows for the successful integration of oxide dielectric films and electrodes on chips such as DRAM chips.

The passivation layer also provides protection to capacitor layers in a wafer during transfer of the wafer to different chambers for deposition of the electrode and dielectric materials during fabrication. For example, a dielectric layer that has not been passified can pick up moisture and hydrogen when exposed to an ambient environment, which can be detrimental and can degrade the dielectric layer. By forming the passivating layer, a protective barrier is formed which prevents unwanted interaction with the ambient environment during wafer transfer.

The present invention provides flexibility in formation of the passivation layer where it is needed. Thus, passivation can be easily achieved at an interface of a capacitor where leakage problems are occurring, such as where high stress is applied at an interface during processing. Standard failure analysis testing can be done to determine the interface or interfaces where passivation should be applied in the capacitor.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of fabricating a semiconductor device, comprising:
    forming a first conductive layer over a semiconductor substrate;
    forming an undensified single dielectric material layer over and in contact with the first conductive layer;
    forming an electrically conducting passivation layer over the undensified single dielectric material layer by exposing said undensified single dielectric material layer to an oxygen-free reducing reactive environment, and wherein said forming an electrically conducting passivation layer is plasma-treatment free; and
    forming a second conductive layer over the passivation layer.

2. The method of claim 1, wherein the semiconductor device is a dynamic random access memory device.

3. The method of claim 1, wherein the first conductive layer, the dielectric layer, and the second conductive layer form capacitor elements.

4. The method of claim 1, wherein the first conductive layer, the dielectric layer, and the second conductive layer are formed by a chemical vapor deposition process.

5. The method of claim 1, wherein the first and second conductive layers comprise a material selected from the group consisting of polysilicon, titanium nitride, tungsten, molybdenum, tungsten silicide, tantalum, tungsten nitride, Pt, Ru, $RuO_x$, Ir, $IrO_x$, Pt combinations, and mixtures thereof.

6. The method of claim 1, wherein the dielectric layer comprises a material selected from the group consisting of silicon nitride, tantalum oxide, strontium titanate, and barium strontium titanate.

7. The method of claim 1, wherein the reactive environment includes a gaseous material selected from the group consisting of nitrogen, hydrogen, ammonia, hydrazine ($N_2H_4$), monomethyl hydrazine (MMH), forming gas ($H_2$+$N_2$), carbon tetrafluoride ($CF_4$), $CHF_3$, hydrochloric acid (HCl), boron trichloride ($BCl_3$), and mixtures thereof.

8. The method of claim 1, wherein the reactive environment is at a temperature from about 100° C. to about 1100° C.

9. The method of claim 1, wherein the reactive environment is at a temperature from about 300° C. to about 1100° C.

10. The method of claim 1, wherein the passivation layer includes a compound having a formula selected from the group consisting of $M(O)_yX_z$, $M(O)_yX_zW_n$, $M_xX_y$, and combinations thereof, wherein O stands for oxygen, M is any species present in the dielectric layer other than oxygen or nitrogen, and wherein X, and W are selected from the group consisting of nitrogen, fluorine, carbon, chlorine, iodine, and $CO_3$, and n, x, y and z are integers from 1 to 6.

11. The method of claim 10, wherein M is selected from the group consisting of silicon, tantalum, strontium titanate, barium strontium titanate, boron, boron phosphate, and phosphorus.

12. The method of claim 1, wherein the passivation layer includes a compound selected from the group consisting of tantalum nitride, tantalum oxynitride, tantalum fluoride, tantalum carbide, and combinations thereof.

13. The method of claim 1, further comprising annealing the passivation layer and the dielectric layer in an oxidizing environment to saturate the passivation layer and the dielectric layer with oxygen prior to forming the second conductive layer.

14. The method of claim 1, wherein the first conductor comprises a first material selected from the group consisting of a metal and polysilicon, and the dielectric layer comprises an oxide of said first material.

15. A method of fabricating a capacitor for a semiconductor device, the method comprising:
   forming a first capacitor electrode over a semiconductor substrate;
   forming an undensified single dielectric material insulating film over the first capacitor electrode;
   forming an electrically conductive passivation layer over the undensified single dielectric material insulating film by exposing said undensified single dielectric material insulating film to an oxygen-free, reducing reactive environment, the passivation layer including a compound having a formula selected from the group consisting of $M(O)_yX_z$, $M(O)_yX_zW_n$, $M_xX_y$, and combinations thereof, wherein O stands for oxygen, M is any species present in the dielectric insulating film other than oxygen or nitrogen, and wherein X, and W are selected from the group consisting of nitrogen, fluorine, carbon, chlorine, iodine, and $CO_3$, and n, x, y and z are integers from 1 to 6, and wherein said forming an electrically conductive layer is plasma-treatment free; and
   forming a second capacitor electrode over the passivation layer.

16. The method of claim 15, wherein the first and second conductive layers comprise a material selected from the group consisting of polysilicon, titanium nitride, tungsten, molybdenum, tungsten silicide, tantalum tungsten nitride, Pt, Ru, $RuO_x$, Ir, $IrO_x$, Pt combinations, and combinations thereof.

17. The method of claim 15, wherein the dielectric layer comprises a material selected from the group consisting of silicon nitride, silicon dioxide, tantalum oxide, strontium titanate, and barium strontium titanate.

18. The method of claim 15, wherein the reactive environment includes a gaseous material selected from the group consisting of nitrogen, hydrogen, ammonia, hydrazine ($N_2H_4$), monomethyl hydrazine (MMH), forming gas ($H_2$+$N_2$), carbon tetrafluoride ($CF_4$), $CHF_3$, hydrochloric acid (HCl), boron trichloride ($BCl_3$), and mixtures thereof.

19. The method of claim 15, wherein the reactive environment is at a temperature from about 100° C. to about 1100° C.

20. The method of claim 15, wherein the reactive environment is at a temperature from about 250° C. to about 1100° C.

21. A method of fabricating a capacitor for a semiconductor device, the method comprising:
   forming a first capacitor electrode over a semiconductor substrate;
   forming a dielectric insulating film over the first capacitor electrode;
   annealing the dielectric insulating film in a reactive, oxygen free, environment in order to form an electrically conductive passivation layer over the dielectric insulating film;
   annealing the passivation layer and the dielectric insulating film in an oxidative environment to saturate the passivation layer and the dielectric insulating film with oxygen; and
   forming a second capacitor electrode over the passivation layer.

22. The method of claim 21, wherein the reactive environment includes a gaseous material selected from the group consisting of nitrogen, hydrogen, ammonia, hydrazine ($N_2H_4$), monomethyl hydrazine (MWH), forming gas ($H_2$+$N_2$), carbon tetrafluoride ($CF_4$), $CHF_3$, hydrochloric acid (HCl), boron trichloride ($BCl_3$), and mixtures thereof.

23. The method of claim 21, wherein the reactive environment is at a temperature from about 100° C. to about 1100° C.

24. The method of claim 21, wherein the reactive environment has been plasma enhanced.

25. The method of claim 21, further comprising annealing the dielectric insulating film in an oxidizing environment prior to forming the passivation layer.

26. The method of claim 21, wherein annealing in the reactive environment and annealing in the oxidative environment are repeated in a cyclic process prior to forming the second capacitor electrode.

27. A method of fabricating a capacitor for a semiconductor device, the method comprising:
   forming a first conductive layer over a semiconductor substrate;
   forming an electrically conductive passivation layer over the first conductive layer by exposing the first conductive layer to a reactive, oxygen free, environment;
   forming a dielectric layer over the passivation layer; and
   forming a second conductive layer over the dielectric layer.

28. The method of claim 27, wherein the reactive environment includes a gaseous material selected from the group consisting of nitrogen, hydrogen, ammonia, hydrazine ($N_2H_4$), monomethyl hydrazine (MMH), forming gas ($H_2+N_2$), carbon tetrafluoride ($CF_4$), $CHF_3$, hydrochloric acid (HCl), boron trichloride ($BCl_3$), and mixtures thereof.

29. The method of claim 27, wherein the reactive environment is at a temperature from about 100° C. to about 1100° C.

30. The method of claim 27, wherein the reactive environment has been plasma enhanced.

31. The method of claim 27, wherein the passivation layer includes a compound having a formula selected from the group consisting of $M(O)_yX_z$, $M(O)_yX_zW_n$, $M_xX_y$, and combinations thereof, wherein O stands for oxygen, M is any species present in the dielectric layer other than oxygen or nitrogen, and wherein X, and W are selected from the group consisting of nitrogen, fluorine, carbon, chlorine, iodine, and $CO_3$, and n, x, y and z are integers from 1 to 6.

32. The method of claim 31, wherein M is selected from the group consisting of silicon, tantalum, strontium titanate, barium strontium titanate, boron, boron phosphate, and phosphorus.

33. The method of claim 27, wherein the passivation layer includes a compound selected from the group consisting of tantalum nitride, tantalum oxynitride, tantalum fluoride, tantalum carbide, and combinations thereof.

34. A method of fabricating a capacitor for a semiconductor device, the method comprising:

forming a first conductive layer over a semiconductor substrate;

exposing the first conductive layer to a first reactive environment in order to form a first passivation layer over the first conductive layer;

forming an undensified dielectric layer over the first passivation layer;

exposing the undensified dielectric layer to a second reactive environment in order to form a second passivation layer over the undensified dielectric layer; and forming a second conductive layer over the second passivation layer, wherein said first and second reactive environments are oxygen-free reactive environments, and wherein at least one of said first and second passivation layers constitutes an electrical conductor.

35. The method of claim 34, wherein at least one of said first and second reactive environments includes a gaseous material selected from the group consisting of nitrogen, hydrogen, ammonia, hydrazine ($N_2H_4$), monomethyl hydrazine (MMH), forming gas ($H_2+N_2$), carbon tetrafluoride ($CF_4$), $CHF_3$, hydrochloric acid (HCl), boron trichloride ($BCl_3$), and mixtures thereof.

36. The method of claim 34, wherein at least one of said first and second reactive environments is at a temperature from about 100° C. to about 1100° C.

37. The method of claim 34, wherein at least one of said first and second reactive environments has been plasma enhanced.

38. The method of claim 34, wherein the first and second passivation layers include compounds having a formula selected from the group consisting of $M(O)_yX_z$, $M(O)_yX_zW_n$, $M_xX_y$, and combinations thereof, wherein O stands for oxygen, M is any species present in the dielectric layer other than oxygen or nitrogen, and wherein X, and W are selected from the group consisting of nitrogen, fluorine, carbon, chlorine, iodine, and $CO_3$, and n, x, y and z are integers from 1 to 6.

39. The method of claim 38, wherein M is selected from the group consisting of silicon, tantalum, strontium titanate, barium strontium titanate, boron, boron phosphate, and phosphorus.

40. A method of fabricating a capacitor for a semiconductor device, the method comprising:

forming a first conductive layer over a semiconductor substrate;

forming a first dielectric layer over and in contact with the first conductive layer;

exposing the first dielectric layer to a reactive, oxygen free, reducing environment in order to form a passivation layer over and in contact with the first dielectric layer;

forming a second dielectric layer over the passivation layer; and forming a second conductive layer over the second dielectric layer.

41. The method of claim 40, wherein the reactive environment includes a gaseous material selected from the group consisting of nitrogen, hydrogen, ammonia, hydrazine ($N_2H_4$), monomethyl hydrazine (MMH), forming gas ($H_2+N_2$), carbon tetrafluoride ($CF_4$), $CHF_3$, hydrochloric acid (HCl), boron trichloride ($BCl_3$), and mixtures thereof.

42. The method of claim 40, wherein the reactive environment is at a temperature from about 100° C. to about 1100° C.

43. The method of claim 40, wherein the reactive environment has been plasma enhanced.

44. The method of claim 40, wherein the passivation layer includes a compound having a formula selected from the group consisting of $M(O)_yX_z$, $M(O)_yX_zW_n$, $M_xX_y$, and combinations thereof, wherein O stands for oxygen, M is any species present in the dielectric layer other than oxygen or nitrogen, and wherein X, and W are selected from the group consisting of nitrogen, fluorine, carbon, chlorine, iodine, and $CO_3$, and n, x, y and z are integers from 1 to 6.

45. The method of claim 44, wherein M is selected from the group consisting of silicon, tantalum, strontium titanate, barium strontium titanate, boron, boron phosphate, and phosphorus.

46. A method of fabricating a capacitor for a semiconductor device, comprising:

forming a first conductive layer over a semiconductor substrate;

forming a first dielectric layer over and in contact with the first conductive layer;

exposing the first dielectric layer to a first reactive environment in order to form a first passivation layer over the first dielectric layer;

forming a second dielectric layer over the first passivation layer;

exposing the second dielectric layer to a second reactive environment in order to form a second passivation layer over the second dielectric layer; and forming a second conductive layer over the second passivation layer, wherein at least one of said first and second reactive environments is an oxygen-free reducing reactive environment.

47. The method of claim 46, wherein at least one of said first and second reactive environments includes a gaseous material selected from the group consisting of nitrogen, hydrogen, ammonia, hydrazine ($N_2H_4$), monomethyl hydrazine (MMH), forming gas ($H_2+N_2$), carbon tetrafluoride ($CF_4$), $CHF_3$, hydrochloric acid (HCl), boron trichloride ($BCl_3$), and mixtures thereof.

48. The method of claim 46, wherein at least one of said first and second reactive environments is at a temperature from about 100° C. to about 1100° C.

49. The method of claim 46, wherein at least one of said first and second reactive environments has been plasma enhanced.

50. The method of claim 46, wherein the first and second passivation layers include compounds having a formula selected from the group consisting of $M(O)_y X_z$, $M(O)_y X_z W_n$, $M_x X_y$, and combinations thereof, wherein O stands for oxygen, M is any species present in the dielectric layer other than oxygen or nitrogen, and wherein X, and W are selected from the group consisting of nitrogen, fluorine, carbon, chlorine, iodine, and $CO_3$, and n, x, y and z are integers from 1 to 6.

51. The method of claim 50, wherein M is selected from the group consisting of silicon, tantalum, strontium titanate, barium strontium titanate, boron, boron phosphate, and phosphorus.

* * * * *

UNITED STATES PATENT AND TRADEMARK OFFICE
CERTIFICATE OF CORRECTION

PATENT NO.    : 6,365,486 B1
DATED         : April 2, 2002
INVENTOR(S)   : Vishnu K. Agarwal, Gurtej S. Sandhu and Garo J. Derderian It is certified that error appears in the above-identified patent and that said Letters Patent is hereby corrected as shown below:

Column 4,
Line 59, after "hydrazine" change "$N_2H_4$)," to -- ($N_2H_4$), --

Column 5,
Line 14, after "$M(O)_yX_z$," change "$M(O))W_n$," to -- $M(O)_yX_zW_n$, --
Line 38, after "dielectric" delete "11"

Column 10,
Line 4, after "tantalum" insert a comma
Line 43, after "hydrazine" change "(MWH)," to -- (MMH), --

Signed and Sealed this

Twenty-first Day of January, 2003

JAMES E. ROGAN
*Director of the United States Patent and Trademark Office*